(12) United States Patent
Pietambaram et al.

(10) Patent No.: US 11,699,648 B2
(45) Date of Patent: *Jul. 11, 2023

(54) ELECTROMIGRATION RESISTANT AND PROFILE CONSISTENT CONTACT ARRAYS

(71) Applicant: Tahoe Research, Ltd., Dublin (IE)

(72) Inventors: Srinivas V. Pietambaram, Chandler, AZ (US); Jung Kyu Han, Chandler, AZ (US); Ali Lehaf, Phoenix, AZ (US); Steve Cho, Chandler, AZ (US); Thomas Heaton, Mesa, AZ (US); Hiroki Tanaka, Chandler, AZ (US); Kristof Darmawikarta, Chandler, AZ (US); Robert Alan May, Chandler, AZ (US); Sri Ranga Sai Boyapati, Chandler, AZ (US)

(73) Assignee: Tahoe Research, Ltd., Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 17/690,964

(22) Filed: Mar. 9, 2022

(65) Prior Publication Data
US 2022/0199515 A1 Jun. 23, 2022

Related U.S. Application Data

(63) Continuation of application No. 17/075,533, filed on Oct. 20, 2020, now Pat. No. 11,309,239, which is a
(Continued)

(51) Int. Cl.
*H01L 23/48* (2006.01)
*H01L 23/52* (2006.01)
(Continued)

(52) U.S. Cl.
CPC ...... *H01L 23/49866* (2013.01); *H01L 21/486* (2013.01); *H01L 23/5383* (2013.01);
(Continued)

(58) Field of Classification Search
CPC combination set(s) only.
See application file for complete search history.

(56) References Cited

U.S. PATENT DOCUMENTS

| 8,830,691 B2* | 9/2014 | Inagaki | H05K 1/186 |
| | | | 361/764 |
| 10,431,537 B1 | 10/2019 | Pietambaram | |

(Continued)

OTHER PUBLICATIONS

U.S. Appl. No. 16/014,134, Notice of Allowance dated May 20, 2019, 10 pgs.

*Primary Examiner* — Niki H Nguyen
(74) *Attorney, Agent, or Firm* — Studebaker & Brackett PC (57) ABSTRACT

A package assembly includes a substrate and at least a first die having a first contact array and a second contact array. First and second via assemblies are respectively coupled with the first and second contact arrays. Each of the first and second via assemblies includes a base pad, a cap assembly, and a via therebetween. One or more of the cap assembly or the via includes an electromigration resistant material to isolate each of the base pad and the cap assembly. Each first cap assembly and via of the first via assemblies has a first assembly profile less than a second assembly profile of each second cap assembly and via of the second via assemblies. The first and second cap assemblies have a common applied thickness in an application configuration. The first and second cap assemblies have a thickness variation of ten microns or less in a reflowed configuration.

20 Claims, 5 Drawing Sheets

Related U.S. Application Data continuation of application No. 16/554,008, filed on Aug. 28, 2019, now Pat. No. 10,854,541, which is a continuation of application No. 16/014,134, filed on Jun. 21, 2018, now Pat. No. 10,431,537.

(51) Int. Cl.

| | | |
|---|---|---|
| *H01L 29/40* | (2006.01) | |
| *H01L 23/498* | (2006.01) | |
| *H01L 23/538* | (2006.01) | |
| *H01L 25/18* | (2023.01) | |
| *H01L 21/48* | (2006.01) | |
| *H01L 23/00* | (2006.01) | |
| *H01L 25/00* | (2006.01) | |

(52) U.S. Cl.
CPC .............. *H01L 24/06* (2013.01); *H01L 24/08* (2013.01); *H01L 24/80* (2013.01); *H01L 25/18* (2013.01); *H01L 25/50* (2013.01); *H01L 2224/0603* (2013.01); *H01L 2224/08235* (2013.01); *H01L 2224/80815* (2013.01); *H01L 2924/3651* (2013.01)

(56) References Cited

U.S. PATENT DOCUMENTS

| | | | |
|---|---|---|---|
| 11,309,239 B2 * | 4/2022 | Pietambaram | H01L 23/49866 |
| 2004/0100293 A1 * | 5/2004 | Bottcher | G01R 31/2884 |
| | | | 324/754.03 |
| 2012/0068322 A1 * | 3/2012 | Hanabe | H01L 23/50 |
| | | | 257/676 |
| 2012/0098120 A1 * | 4/2012 | Yu | H01L 24/13 |
| | | | 257/737 |
| 2012/0292779 A1 * | 11/2012 | Interrante | H01L 25/0657 |
| | | | 257/774 |
| 2013/0087910 A1 * | 4/2013 | Abdul Razak | H01L 24/14 |
| | | | 257/737 |
| 2013/0147052 A1 * | 6/2013 | Zhang | H01L 24/05 |
| | | | 257/E21.585 |
| 2014/0061889 A1 * | 3/2014 | Noma | H01L 24/16 |
| | | | 148/528 |

* cited by examiner

ELECTROMIGRATION RESISTANT AND PROFILE CONSISTENT CONTACT ARRAYS

CROSS-REFERENCE TO RELATED APPLICATIONS

This application is a continuation of U.S. patent application Ser. No. 17/075,533, filed Oct. 20, 2020, which is a continuation of U.S. patent application Ser. No. 16/554,008, filed Aug. 28, 2019, now U.S. Pat. No. 10,854,541, issued Dec. 1, 2020, which is a continuation of U.S. patent application Ser. No. 16/014,134, filed on Jun. 21, 2018, now U.S. Pat. No. 10,431,537, issued on Oct. 1, 2019, the entire contents of which are hereby incorporated by their reference herein.

TECHNICAL FIELD

This document pertains generally, but not by way of limitation, to device packages, and contacts and contact arrays providing electrical connections in device packages.

BACKGROUND

Packages including devices such as semiconductors include a plurality (e.g., thousands) of conductive traces. Contacts including contact pads, vias, solder balls, pins or the like provide terminals for connection with devices and facilitate interconnections between devices. In some examples, a substrate is provided beneath each of one or more component devices. The substrate includes the interconnections between the devices including conductive traces and the like. In some examples, the contacts (pads, vias, caps, solder balls or the like) that provide interconnections number in the thousands, for instance twenty to forty thousand contacts or more.

In packages having a plurality of devices including embedded multi-die interconnect bridge (EMIB) packages and Patch on Interposer (PoINT) packages, Silicon bridge die with fine routing layers are included to provide interconnections, such as densely packed (e.g., fine pitch) caps, vias and conductive traces between devices. In various examples, the packages are formed with laminated dielectric build-up layers. For instance, active die or the like are coupled through the bridge die embedded within the substrate and dielectric layers are built up around and over the bridge die.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, that a problem to be solved can include reducing bump thickness variation (BTV) in the package via assemblies (caps and vias) that are provided in a dense format (e.g., with a fine pitch, corresponding to the center to center distance between features), and possibly with variable sizes of caps and vias (e.g., diameters), while at the same time maintaining or even enhancing electromigration resistance in the package caps and vias.

Smaller and more densely packed (finer pitch) caps and vias are used for fine die to die connections. Fine pitch caps and vias minimize data throttling between logic die (processors) and memory die (memory), while minimizing the overall footprint of packages and devices. Vias and caps are subject to electromigration (via and cap material mixing and consumption in the presence of voltage and current). Electromigration decreases conductivity of vias (decreases the Imax capability which represents the maximum current that can be passed through the via before its conductivity is reduced below a specified value) and also makes vias brittle and prone to failure due to formation of inter-metallic compounds (IMCs, such as alloys of copper and tin). In some examples, an intervening layer of nickel is provided in the cap between a via apex and a solder cap layer of the cap. The nickel layer retards the electromigration of copper and tin. Further, increasing the thickness of the nickel layer and the tin layer provide a corresponding increase in electromigration resistance and reduction in IMC growth while increasing the thickness of the cap.

However, with the increasing density of caps, vias and conductive traces to enhance data flow between devices (e.g., with fine arrays of vias, photolithographed traces, bridge die or the like) nickel layers are not effectively applied within small orifices, for instance orifices provided for the formation of caps (substrate side contacts). The thickness of nickel deposited is reduced to ensure no bridging of the bumps or to ensure BTV is low. The minimized nickel layer has reduced electromigration resistance and the via experiences increased IMG growth and decreased Imax capability.

Further, package substrates with connection enhancing features like bridge die (in EMIB) and PoINT (patch on interposer) are built with laminated dielectric build-up layers. As the layers are built around and over the bridge die and patches, between densely formed vias or the like undulations are created around these features that increase variation of thickness of the caps (e.g., bump thickness variation or BTV). BTV frustrates consistent and reliable bonding between die and connected substrates.

Further, variations in the size (diameter) of via assemblies in the same package while applying a common solder and nickel plating thickness generates greater BTV upon reflowing between different sized via assemblies. Stated another way, the same thickness of tin and nickel plating will, when reflowed, provide a large variation in cap thickness (bump height or bump thickness) between the large and small via assemblies. Variations in cap thickness (i.e., increased BTV) decrease the reliability of connection between devices and via assemblies. Instead of providing a planar array of caps for connection, the caps with increased BTV provide a tilted, undulating array of substrate side contacts or the like that poorly connect with the die side contacts of die.

In various examples, one or more of the nickel or solder layers are made thinner in plating processes to decrease bump height and accordingly minimize bump height variation (BTV). In effect, the thinner the initial plating thickness of Ni and Sn is, the less variation there is in bump thickness (e.g., decreased BTV) after reflow between large and small caps. However, decreasing the thickness of the plating of solder and nickel further frustrates the issues with thin nickel layers (decreased electromigration resistance). Electromigration resistance is decreased because of the decreased thickness (to minimize BTV) of nickel layers. Accordingly, IMC growth is promoted and Imax capability is decreased. Stated another way, a decrease in plating thickness to decrease BTV adversely decreases electromigration resistance, and an increase in plating thickness to address electromigration resistance adversely increases BTV.

The present subject matter helps provide a solution to these problems with a package assembly including a plurality of via assemblies that provide electromigration resistant vias in place of or in addition to layers of nickel or nickel alloys in the cap. As previously described thin layers of nickel in caps decreases electromigration resistance and negatively impact various characteristics (e.g., Imax capability and IMC growth). The present subject matter provides electromigration resistant features that are relatively long (and thereby thick) with regard to a copper base pad and a solder cap (tin). For instance, a via passage is filled with a nickel or nickel alloy filler in contrast to a copper filled via passage. The nickel (including a nickel alloy) filled via readily isolates the base pad and the cap from each other. For instance, a copper base pad is remotely positioned relative to a solder (tin) cap because of the intervening electromigration resistant via. Additionally, the electromigration resistance via includes a relatively large volume of the electromigration resistant filler (because of its length) compared to the volume of either of the base pad (e.g., copper) or the cap (tin), thereby further minimizing electromigration between these materials. Furthermore, arrays of contacts on die and via assemblies on substrates are provided in a dense profile (e.g., with fine pitch) because the via assemblies include electromigration resistant vias, and plating of nickel within small cap orifices is minimized (e.g., reduced or eliminated). Accordingly, even dense arrays of via assemblies are provided that are also electromigration resistant and thereby provide enhanced Imax capability with minimized IMC growth.

Further still, because via assemblies include the electromigration resistant material in the via passage the caps are, in one example, relatively thin because the nickel layer of other package assemblies is absent or minimized. Accordingly, variation in cap thickness (e.g., BTV) is minimized at reflow of the via assemblies, even with via assemblies having a variety of profiles (sizes, diameters or the like).

In another example, the via assemblies include other features configured to increase electromigration resistance while at the same time minimizing BTV. For instance, the cap is provided as a multi-component assembly including a solder cap layer and an underlying electromigration resistant cap layer, such as a nickel alloy doped with one or more of tungsten, molybdenum, or ruthenium. The electromigration resistant cap layer has higher electromigration resistance than nickel alone, and accordingly is applied in thinner layers than nickel while still achieving increased electromigration resistance and its attendant benefits (e.g., increased Imax capability and decreased IMC growth). Additionally, by minimizing the thickness of the cap with a thinly applied electromigration resistant cap layer the overall thickness of the cap is minimized and accordingly BTV is decreased between large and small profile (e.g., diameter) via assemblies that are plated with caps having the same initial thickness (of a solder layer and electromigration resistance cap layer).

This overview is intended to provide an overview of subject matter of the present patent application. It is not intended to provide an exclusive or exhaustive explanation of the disclosure. The detailed description is included to provide further information about the present patent application.

Figure 1:
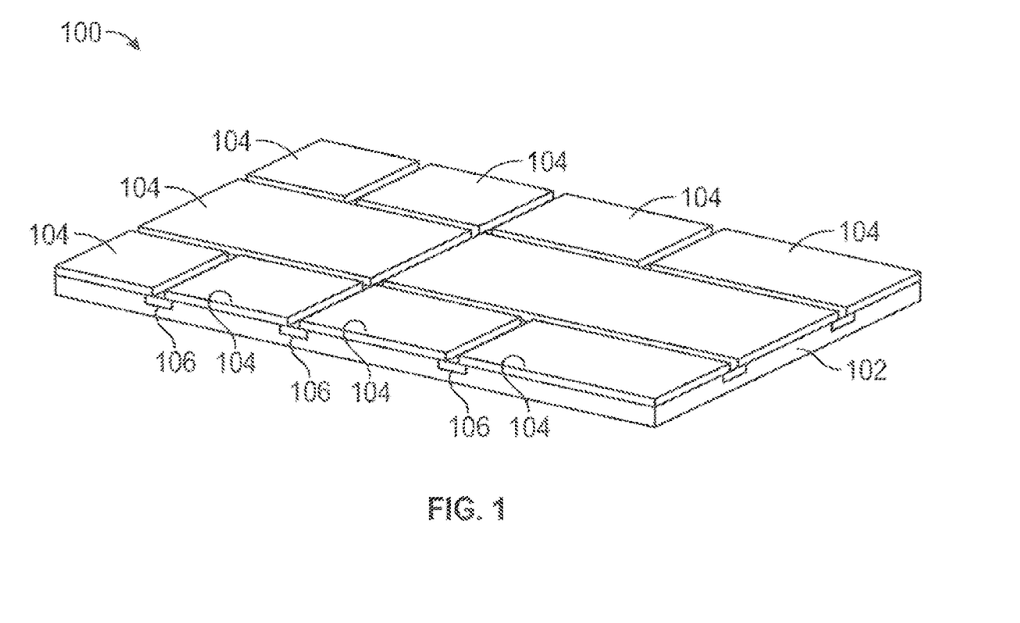
FIG. 1 is a perspective view of one example of a package assembly including one or more devices.

FIG. 1 shows a perspective view of one example of a composite device assembly 100 (e.g., an exemplary package assembly). As shown, the composite device assembly 100 includes a package body 102 forming a substrate for supporting one or more devices such as the devices 104 (e.g., one or more dies) shown on the package body 102. The composite device assembly 100 provides a monolithic base for reception of the plurality of devices 104 and interconnection of the devices. The devices 104 include, but are not limited to active devices, logic devices, memory devices or the like (including, but not limited to, dies, packages including one or more dies or the like).

The composite device assembly 100 includes a plurality of interconnecting features that connect the various devices 104 (including devices embedded in the substrate). One example of the interconnecting features includes bridges 106 (bridge dies) interposed between the devices 104. As will be described herein the bridges 106 are locally positioned adjacent to one or more devices 104 and provide interconnections to allow for communication (and optionally the delivery of power) between the devices 104. The bridges 106 include a plurality of conductive traces or the like configured to interconnect the devices 104. In some examples, the bridges 106 include dense (e.g., high pitched) conductive traces that provide numerous interconnections between devices 104 in the relatively compact bridges 106, for instance relative to individually patterned conductive traces.

In other examples, composite device assemblies include other interconnecting features, such as via assemblies, conductive traces or the like formed or provided to the substrate (e.g., the package body 102). These features are formed with build-up techniques including, but not limited to, techniques that gradually build layers of the substrate, photolithograph the features or the like. In still other examples, the interconnecting features include other intervening components similar to bridges 106, such as a Patch which can house an embedded bridge that interconnect devices.

Figure 2:
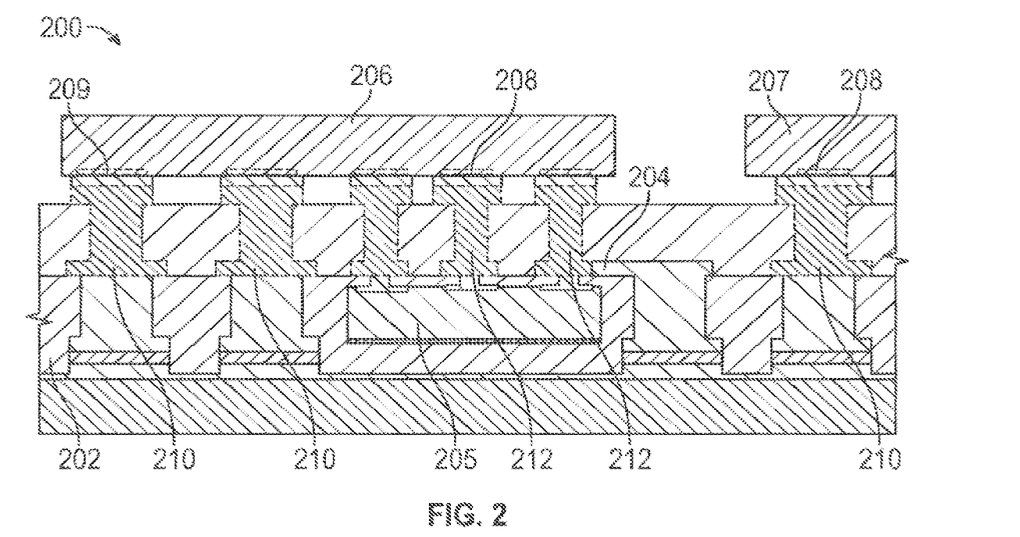
FIG. 2 is a schematic cross sectional view of one example of a package assembly including at least one device having contacts coupled with vias.

FIG. 2 shows one example of a package assembly 200. The package assembly 200 shown in FIG. 2 is, in one example, a composite device such as the composite device assembly 100 shown in FIG. 1. In another example, the package assembly 200 shown in FIG. 2 is a component of an overall composite device assembly. As shown in FIG. 2, the package assembly 200 includes one or more dies 206, 207 coupled with a plurality of via assemblies 210, 212 provided with the substrate 202. As shown, the via assemblies 210, 212 extend through the substrate 202, for instance, for connection with one or more conductive traces 204 or interconnecting features such as a bridge die 205 (e.g., having a dense, finely pitched array of conductive traces extending into and out of the page). Although FIG. 2 shows one example of a bridge die 205, other examples can have multiple bridge dies or active dies with or without Through Silicon Vias (TSVs). In still other examples, the via assemblies 210, 212 are coupled with conductive traces not associated with a bridge die 205 and having one or more of fine or coarse pitch (e.g., center to center distance) between the traces according to the architecture of the package assembly.

Referring again to FIG. 2, the die 206 is shown with a variety of contact arrays, for instance, first and second contact arrays 208, 209. As shown in FIG. 2, the first contact array 208 is coupled with a more densely arranged series of via assemblies 212. In contrast, the second contact array 209 is coupled with one or more via assemblies 210 arranged in a less dense or coarse configuration (density) relative to the via assemblies 212 of the first contact array 208. In one example, the first and second contact arrays 208, 209 are provided on the die 206 to provide one or more electrical contacts for connection with other features of the package assembly 200 including, for instance, one or more bridge dies 205, other dies provided with the package assembly 200 and one or more interconnecting features such as the via assemblies 210, 212. In one example, the inclusion of high density contact arrays 208, for instance, having a fine pitch, as shown in FIG. 2, enhances the number of connections provided by the package assembly 200 and, in some examples, decreases the throttling of data or power to and from the die 206 to other components of the package assembly 200. Further, the high density contact arrays 208 are correspondingly coupled with via assemblies, such as assemblies 212, provided with a similar fine pitch (e.g., high density).

As further shown in FIG. 2, each of the first and second contact arrays 208, 209 are coupled with corresponding via assemblies 212, 210. In one example, the first contact array 208 having a finer pitch relative to the second contact array 209 correspondingly has densely packed or fine pitched via assemblies 212. In the example shown in FIG. 2, the via assemblies 212 interconnect the package assembly 200 and the first contact array 208 thereon with one or more components, for instance, the bridge die 205 shown in FIG. 2. The second contact array 209, as shown in FIG. 2, has a coarse pitch and is thereby less densely packed than the first contact array 208. Accordingly, the via assemblies 210 associated with the second contact array 209 are less dense or have a coarser pitch relative to the via assemblies 212. As shown in the example of FIG. 2, the via assemblies 210 are optionally coupled with one or more conductive traces, additional vias or the like.

As further shown in FIG. 2, the via assemblies 210, 212 include varying profiles, for instance, one or more of diameter, shapes or the like relative to each other. In the example shown, the via assemblies 210 are relatively larger or have a larger profile (e.g., diameter, width or the like) relative to the via assemblies 212. As described herein, variations in via assemblies such as the via assemblies 210, 212 including variations in their profile (e.g., diameters, width, shape or the like) as well as variations in density such as the fine pitch of the via assemblies 212 (and accordingly dense packing of the via assemblies 212) relative to the coarse pitch of the via assemblies 210 (or less dense packing of the via assemblies 210), for instance, in the substrate 202.

The via assemblies 210, 212, as described herein, include one or more features configured to enhance electromigration resistance of the via assemblies 210, 212 and accordingly minimize (e.g., including minimize, eliminate or the like) migration of one or more materials of the via assemblies 210, for instance, copper in a base pad and tin in the solder that, in some examples, decreases the maximum current to the via assemblies 210, 212 (Imax) and increases intermetallic compound growth (IMC). Further, the via assemblies 210, 212 described herein provide enhanced electromigration resistance while at the same time minimizing variation in bump height, for instance, corresponding to one or more of thickness or height variation of the caps of each of the via assemblies 210, 212. Providing each of the via assemblies 210, 212 with a relatively planar interface profile, for instance, a planar die interface profile ensures consistent and reliable coupling between the dies 206, 207 and the corresponding via assemblies 210, 212. For instance, one or more of tilting, canting or the like of the dies 206, 207 relative to the corresponding caps of the via assemblies 210, 212 is minimized. Accordingly, when reflowed, for instance, to fix the dies 206, 207 to the corresponding via assemblies 210, 212 robust mechanical couplings are formed therebetween to ensure consistent and reliable electrical interconnection of the dies 206, 207 with corresponding other features of the package assembly 200 including, but not limited to, bridge dies 205, other logic or active dies or the like.

Figure 3A:
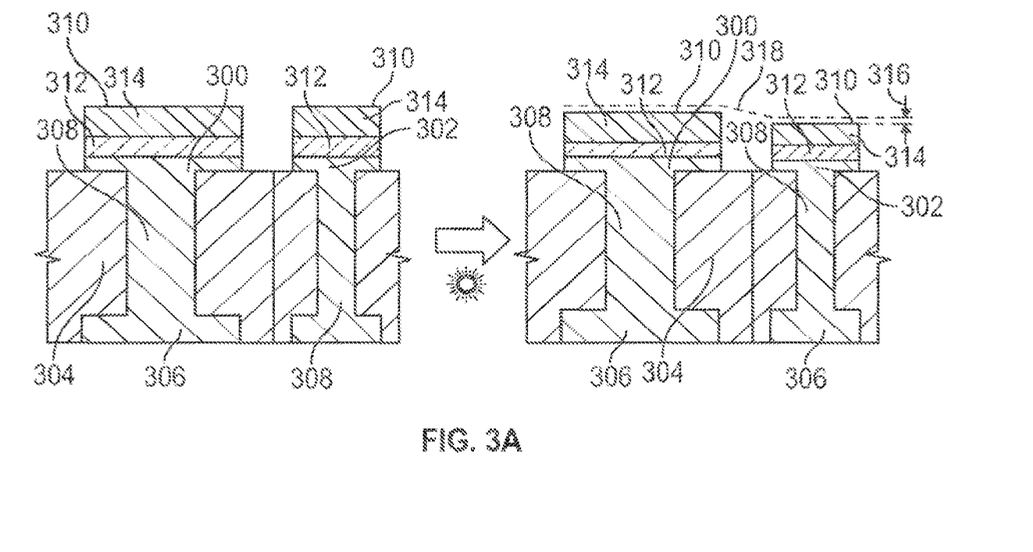
FIG. 3A is a detailed schematic cross sectional view of a portion of a package assembly having vias in application and reflowed configurations.

FIG. 3A shows one example of via assemblies 300, 302 in two configurations. In the first configuration provided on the left of FIG. 3A, the via assemblies 300, 302 are in an application configuration, for instance, including caps 310 having an interface cap layer 312 and a solder cap layer 314 provided above a via, such as the vias 308. In these examples, the interface cap layer 312 and the solder cap layer 314 of each of the via assemblies 300, 302 are shown in an as-applied configuration (e.g., the application configuration). The interface cap layer 312 and the solder cap layer 314 of each of the via assemblies 300, 302 are, in one example, applied through plating, for instance, with a consistent thickness across each of the via assemblies 300, 302. By plating each of the interface cap layer 312 and the solder cap layer 314, the caps 310 of each of the via assemblies 300, 302 are initially formed with an identical thickness, height or the like as shown, for instance, in the first (left) portion of FIG. 3A. As further shown, the via 308 of the vias assembly 300 extends from the cap 310, for instance, to a base pad 306 within the substrate 304. Further, the via assembly 302 also includes a via 308 extending to a base pad 306 within the substrate 304.

Referring now to the right portion of FIG. 3A, an after reflow configuration or reflowed configuration is shown. Each of the via assemblies 300, 302 is shown in a different (heated or after heated) configuration relative to the application configuration shown, for instance, in the left portion of FIG. 3A. The via assembly 300 includes the cap 310 having the solder cap layer 314 positioned over the interface cap layer 312. After reflowing, the cap 310 of the larger via assembly 300 has changed its height (or thickness) relative to the previous dimensions of the cap 310 of the via assembly 300 shown in the left portion of FIG. 3A. For instance, each of the reflowed interface cap layer 312 and the solder cap layer 314 are shown in the right portion having a marginally decreased thickness or height relative to the layers 312, 314 on the left side of FIG. 3A.

As further shown in FIG. 3A, the (smaller profile) via assembly 302 in the reflowed configuration has varied dimensions relative to its initial configuration in the application configuration shown in the left portion of the figure. For instance, the via assembly in the reflowed configuration including, for instance, the cap 310 and its component solder cap layer 314 and interface cap layer 312 are shown with a minimized height, thickness or the like relative to the cap 310 shown in the left portion of FIG. 3A (e.g., application configuration).

As further shown in the reflowed configuration, each of the via assembly 300 and the via assembly 302 have a thickness (or height) variation 316 therebetween. In one example, variations in the profiles of the via assemblies 300, 302, for instance, their diameter, shapes or the like triggers corresponding variations upon reflowing of the caps 310. For instance, each of the solder cap layer 314 and interface cap layer 312 of each of the via assemblies 300, 302 changes to a differing height relative to their initial configurations and further change to different heights relative to each other in the reflowed configuration. This variation is shown with the thickness (or height) variation 316 in FIG. 3A. Additionally, as shown by the broken lines in FIG. 3A, an undulating die interface profile 318 is provided by each of the via assemblies 300, 302 including, for instance, their respective caps 310. The thickness or height variation 316 provides the undulating die interface profile 318 and provides a tilted or non-planar configuration for interfacing with the corresponding contacts of a device, such as the die 206 shown, for instance, in FIG. 2. When the die 206 is coupled with the via assemblies 300, 302 having the undulating die interface profile 318 post reflowing, the tilted configuration of the via assemblies 300, 302 frustrates the reliable and robust coupling between the via assemblies 300, 302 and the die 206. For instance, the die 206 is tilted, canted or the like while coupled along the via assemblies 300, 302 according to the undulating die interface profile 318. Some of the via assembly 300, 302 have weak or unreliable connections that fail, partially fail, short circuit or the like when tested, during use or the like.

Referring again to FIG. 3A, in some examples, the variation (e.g., thickness or height variation 316) and the corresponding undulating die interface profile 318 are, in some examples, addressed, for instance, by decreasing the thickness of the caps 310 of each of the via assemblies 300, 302. In one example, the caps 310 have a minimized height when initially plated (e.g., in the application configuration). By decreasing the thickness of the caps 310, 312, for instance, by minimizing the thicknesses of the interface cap layer 312, solder cap layer 314 or the like at application of the layers, in practice, the thickness or height variation 316 is also minimized in the reflowed configuration. Stated another way, in one example greater height variation 316 after reflowing occurs with taller caps 310 (e.g., in the initial application configuration), and conversely decreased height variation 316 occurs with shorter caps 310 (in the initial application configuration). Accordingly, the caps 310 of each of the via assemblies 300, 302, in some examples, assume a configuration having a minimized undulating die interface profile 318. However, decreasing of one or more of the layers, for instance, the interface cap layer 312, in one example including nickel, decreases the overall electromigration resistance of the via assemblies 300, 302. For instance, decreasing the interface cap layer 312 removes some volume of the intervening nickel between the copper in the via 308 and the solder (tin) in the solder cap layer 314 and more readily permits the intermetallic compound growth between the solder cap layer 314 and the via 308. One or more of the maximum current (such as Imax) of the via assemblies 300, 302 is thereby sacrificed in exchange for decreasing the height variation or thickness variation 316 of the via assemblies 300, 302.

Figure 3B:
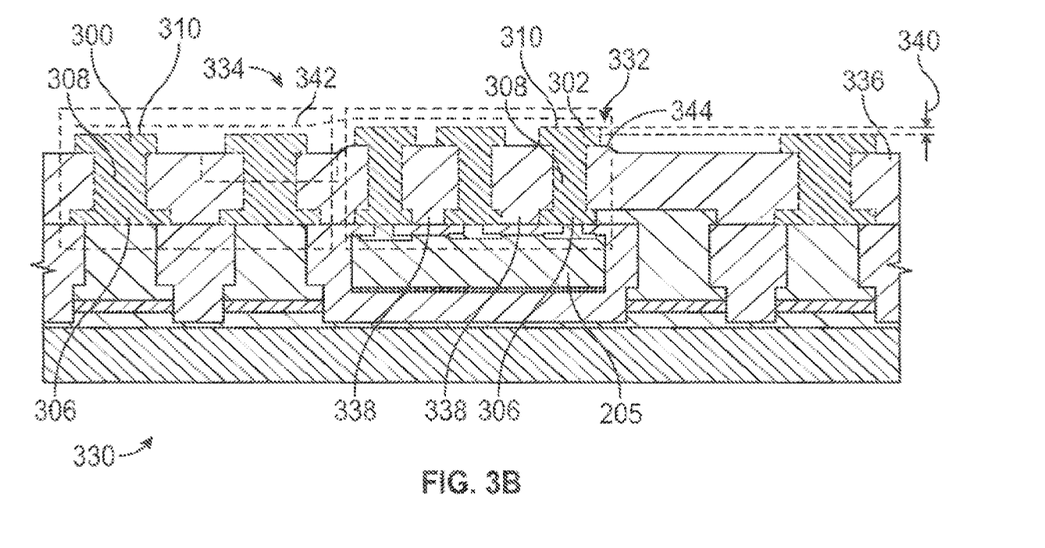
FIG. 3B is a detailed schematic cross sectional view of another portion of a package assembly including vias and an interconnection enhancing bridge die.

FIG. 3B shows another example of a package assembly 330 with devices, such as the dies 206, 207, removed for illustration purposes. As shown in FIG. 3B, the package assembly 330 includes the via assemblies 300, 302. In this zoomed out view relative to FIG. 3A, the via assemblies 302 are provided in a first via assembly array 332, for instance, having a fine pitch (increased density) relative to the via assemblies 300 of a second via assembly array 334. As shown and previously described herein, the via assemblies 302 have a smaller profile (e.g., diameter, width or the like) relative to the via assemblies 300 of the second via assembly array 334. Additionally, the via assemblies 302 of the first via assembly array 332 are more densely clustered, packed or the like (have a finer pitch) relative to the via assemblies 300 of the second via assembly array 334. The smaller via assemblies 302 have vias 308 extending from base pads 306 to corresponding caps 310 with smaller profiles (diameters, widths or the like), for instance, profiles of 23 microns or less, 10 microns or less, 6 microns or less or the like. Conversely, the vias 308 of the via assemblies 300, for instance, of the second via assembly array 334 have profiles larger than those of the first assembly via array 332. For instance, the vias 308 of the second via assembly array 334 and the component via assemblies 300 include profiles (diameters, widths or the like) of 70 microns or less, 45 microns or less or the like.

As further shown in FIG. 3B, the package assembly 330 also includes one or more interconnecting features, for instance, a bridge die 205 provided in the substrate 336. As previously described herein, the bridge die 205, in one example, provides densely packed (e.g., fine pitch) conductive traces or the like configured to provide a high density series of contacts and interconnections between one or more devices, for instance, the die 206, die 207 or other components of the package assembly 330 (or package assembly 200 shown in FIG. 2) or the composite device assembly 100 shown in FIG. 1. In some examples, the inclusion of one or more features such as bridge die 205 or densely packed conductive traces localizes or clusters the vias or via assemblies such as the via assemblies 302 of the first via assembly array 332 in a dense or finely pitched configuration such as that shown in FIG. 3B. By filling the zone above the bridge die 205 with finely pitched via assemblies 302 space otherwise used, for instance, by the substrate build-up dielectric, 336 is assumed. Accordingly, as the space 336 is built up around one or more features of the package assembly 330 using the dielectric, for instance, the various via assemblies 300, 302 of the respective second and first via assembly arrays 334, 332, the dielectric that fills the interstitial spaces 338 between the vias 308, is not able to spread as with the spacing between the via assemblies 300, and is elevated relative to the remainder of the substrate 336.

As shown in FIG. 3B, the clustered dielectric 338 between the vias 308 has additional height and provides one or more substrate variations 344 relative to the remainder of the substrate 336. In one example, the iterative buildup of the via assemblies 302, 300 continues relative to the substrate 336 and the substrate variations 344. Accordingly, the caps 310 of the via assemblies 300 are relatively recessed or relative to the caps 310 of the via assemblies 302. For instance, as shown in FIG. 3B, the caps 310 of the first via assembly array 332 are positioned at a relatively higher elevation relative to the caps 310 of the second via assembly array 334. In a similar manner to the configuration shown in FIG. 3A with the reflowed configuration, the variation in heights of the caps 310 of each of the first and second via assembly arrays 332, 334 generates an undulating die interface profile 342 corresponding to a thickness or height variation 340. The undulating die interface profile 342 accordingly provides a non-planar interface for connection with one or more devices such as the dies 206, 207. Accordingly, one or more of robust and reliable electrical communication and connection of the dies 206, 207 with associated features of the package assembly 330 is frustrated.

In some examples, the thickness or height variation 340 shown in FIG. 3B caused by substrate build-up dielectric variations 344 and the thickness (or height) variation 316 caused, for instance, by the variations in profiles of the via assemblies 300, 302 and the thickness of their component caps 310 occur in tandem to further exaggerate thickness or height variations 340, 316 and their corresponding undulating die interface profiles 342, 318. Stated another way, the undulating profiles 342, 318 shown in each of FIGS. 3B and 3A are, in some examples, further negatively enhanced by each of these phenomenon to accordingly further frustrate the robust and reliable coupling of dies 206, 207 with underlying via assemblies, for instance, the first and second via assembly arrays 332, 334.

Figure 4:
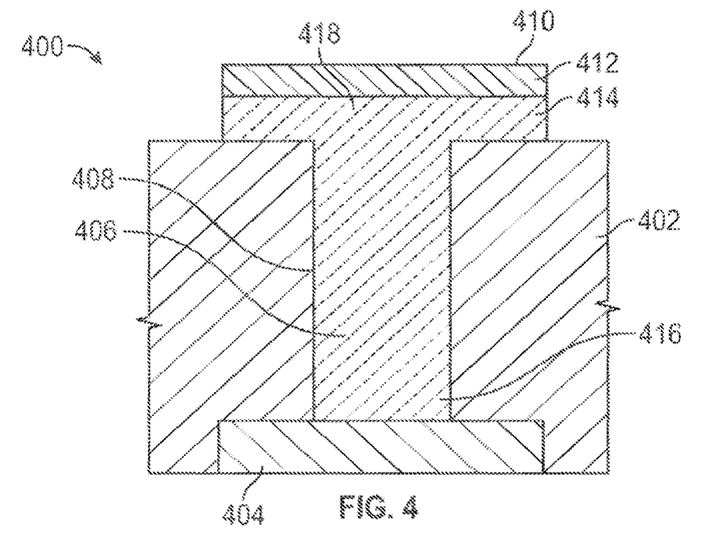
FIG. 4 is a detailed cross section of one example of a package assembly including via assemblies having an electromigration resistant material including electromigration resistant vias.

FIG. 4 shows one example of a via assembly 400, for instance, for use as one or more of the via assemblies 300, 302 shown in FIG. 3B. As shown in FIG. 4, the via assembly 400 includes a base pad 404, a cap 410, and an intervening electromigration resistant via 406. In one example, the base bad 404 includes copper, and the cap 410 includes solder (e.g., tin). The electromigration resistant via 406 is provided within a substrate 402, for instance, a substrate including, but not limited to, a dielectric or other material built up in one or more layers as a laminate or the like to accordingly form the substrate of a package assembly, device or the like. As further shown in FIG. 4, the substrate 402 provides a via passage 408 and the electromigration resistant via 406 extends within the via passage 408, for instance, from a via base 416 to a via apex 418. In one example, the via apex 418 is proximate to the cap 410 and the via base 416 is proximate to the base pad 404.

As further shown in FIG. 4, the cap 410, in one example, includes a solder cap layer 412. The solder cap layer 412 includes, but is not limited to, tin or tin alloys. Conversely, the base pad 404 is, in one example, formed with copper and is configured for coupling with a conductive trace, such as one or more of the conductive traces 204 shown, for instance, in FIG. 2. Alternatively, the base pad 404 is a portion of the conductive trace.

Referring again to FIG. 4, as previously described, the via assembly 400 includes an electromigration resistant via 406 provided within the via passage 408 of the substrate 402. In one example, the electromigration resistant via 406 is formed within the via, for instance, by way of a plating process or other process that fills the via passage 408 and provides a conductive trace for interconnection between the base pad 404 and the cap 410. In this example, the electromigration resistant via includes, but is not limited to one or more of a nickel or nickel alloy via, a cobalt alloy via, an iron alloy via or the like. In other examples, for instance, where the electromigration resistant via 406 includes a nickel alloy, the nickel alloy is doped with one or more materials including, but not limited to, tungsten, molybdenum or ruthenium. The electromigration resistant via 406, in one example, includes a third conductive material (e.g., an electromigration resistant material) relative to a first conductive material of the base pad 404 and a second conductive material of the cap 410. In this example, the third conductive material is an electromigration resistant material including one or more of nickel, nickel alloy or any of the other alloys described previously herein.

As shown in FIG. 4, the volume of the electromigration resistant material (e.g., the third conductive material) is, in this example, greater than the respective volumes of one or more of the cap 410 including, for instance, the solder cap layer 412 and the volume of the first conductive material of the base pad 404. Accordingly, the cap 410 (e.g., tin) is isolated from the base pad 404 (e.g., copper) by a relatively larger quantity and dimension of the third conductive material, such as an electromigration resistant material. Additionally, the interpositioning of the electromigration resistant via 406, for instance, in an elongate manner extending from the via base 416 toward the via apex 418 dimensionally isolates the cap 410 from the base pad 404.

Further, in still other examples, the via assembly 400 including the cap 410 optionally includes an electromigration resistant cap layer 414. In one example, the electromigration resistant cap layer 414 is constructed with a material similar to or identical to the third conductive material of the electromigration resistant via 406. Accordingly, the cap 410 is, in one example, a cap assembly including the solder cap layer 410 and the optional electromigration resistant cap layer 414.

In the example shown in FIG. 4, the via assembly 400 provides a cap 410 that minimizes one or more electromigration resistant features (such as nickel plated layers included in a cap and not in the via) and accordingly minimizes the height or thickness of the cap 410 relative to previous caps. For instance, the electromigration resistant material (a third conductive material, in this example) is provided in the via passage 408 in place of a material in the cap 410 subject to electromigration and intermetallic growth with tin, such as copper. Instead, the cap 410, in one example, includes a solder cap layer 410 without an electromigration resistant layer, or includes a minimal electromigration resistant cap layer 414 (as shown). The electromigration resistant material is positioned within the via passage 408 to facilitate a smaller profile cap 410, for instance, a cap having a decreased height, thickness or the like relative to previous via assembly designs (e.g., see FIG. 3A) having relatively thick nickel plated layers.

The cap 410 (e.g., height, thickness or the like) has a minimized profile at its application configuration (before reflow) and accordingly, when reflowed, the variation between multiple caps 410 of multiple via assemblies 400 is also minimized. Further, even with variations in via assembly profiles (e.g., larger and smaller diameter via assemblies) the minimized caps 410 improve (decrease) the variation in thickness and die interface profile after reflow, in contrast to the pronounced thickness (or height) variation 316 and corresponding undulating die interface profile 318 shown in FIG. 3A. The improvements including minimized thickness variation and corresponding planar interface profiles of the via assemblies are achieved while at the same time retaining or even enhancing electromigration resistance in the via assemblies 400. Put another way, the electromigration resistant material within the electromigration resistant via 406 isolates the cap 410 from the base pad 404 and, at the same time, allows for minimizing of the thickness or height of the cap 410. The minimized dimension of the cap 410 facilitates the decreased variation of the cap 410 height in the reflowed configuration (e.g., minimizes BTV).

Figure 5:
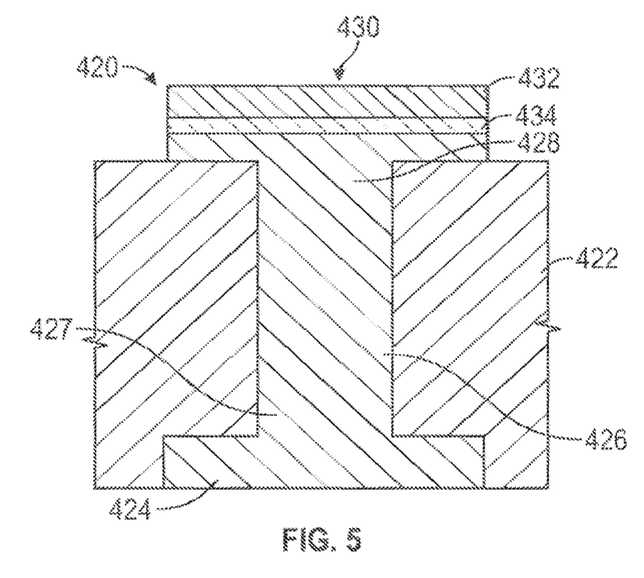
FIG. 5 is a detailed cross section of another example of a package assembly including via assemblies having electromigration resistant material including an electromigration resistance cap layer.

Referring now to FIG. 5, another example of a via assembly 420 is shown. In this example, the via assembly 420 includes one or more components similar to the via assembly 400 previously described and shown in FIG. 4. For instance, the via assembly 420 includes a base pad 424, such as a copper base pad, and a cap assembly 430 including a solder cap layer 432. The via assembly 420 is provided in a substrate 422 including, but not limited to, a dielectric or other material built up in one or more layers as a laminate or the like. In one example, the solder cap layer 432 includes tin. Further, the via assembly 420 includes a via 426, for instance, a copper via, nickel or nickel alloy via, cobalt alloy, iron alloy via, doped via or the like. The via 426 extends from a via base 427 to a via apex 428. The via base 427 is, in one example, proximate to the base pad 424 and the base pad 424 is, in one example, proximate to or included with a conductive trace (e.g., the conductive trace 204 of a package assembly as shown in FIG. 2). The cap assembly 430 (e.g., an example of a cap) is proximate to the via apex 428. Accordingly, the via 426 extends from the base pad 424 and provides an electrical interconnection between the cap assembly 430 and the base pad 424.

In the example shown in FIG. 5, the via assembly 420 includes a cap assembly 430 having the solder cap layer 432. Additionally, the cap assembly 430 includes an electromigration resistant cap layer 434. In a similar manner to the via assembly 400, the electromigration resistant cap layer 434 includes an electromigration resistant material (e.g., a third conductive material) including, but not limited to, one or more of a nickel alloy, cobalt alloy, iron alloy or the like. In other examples, the nickel alloy includes one or more dopants such as tungsten, molybdenum, ruthenium or the like as previously described herein. The increased electromigration resistance of the electromigration resistance cap layer 434 decreases intermetallic growth between the materials of the solder cap layer 432 (e.g., tin) and the base pad 424 and the via 426 (e.g., copper) and enhances Imax (maximum current) for the via assembly 400. In other examples, the via 426 also includes an electromigration resistant material, for instance, one or more of a nickel, nickel alloy, cobalt alloy, iron alloy or one or more of the doped alloys described herein.

In a manner similar to the via assembly 400, the cap assembly 430 has a relatively decreased dimension or profile relative to caps of via assemblies, such as the via assemblies 300, 302 shown in FIG. 3A. In example shown in FIG. 5, the cap assembly 430 includes the electromigration resistant cap layer 434 having a higher electromigration resistance relative to nickel and at least some nickel alloys applied as the interface layer 312 in FIG. 3A. The increased electromigration resistance facilitates the application, for instance, plating of a layer 434 that is relatively thinner than the interface layer 312 (shown in FIG. 3A). For instance, the interface layer 312 is around three microns, and in some examples the layer 434 is approximately half that (e.g., around 1.5 microns) while having approximately the same electromigration resistance as the interface layer 312. Accordingly, the cap assembly 430, including the electromigration resistant cap layer 434, is minimized similarly to the cap 410 shown in FIG. 4 (having the electromigration resistance via 406). Accordingly, variation of the thickness (or height) of the cap assemblies 430, including the via assemblies 420, are minimized relative to designs having thicker cap assemblies 430. For instance, because the cap assemblies 430 have minimized profiles as described herein the variation therebetween thickness (e.g., BTV) in a reflowed configuration is decreased relative to the thickness variation 316 shown in FIG. 3A.

Figure 6:
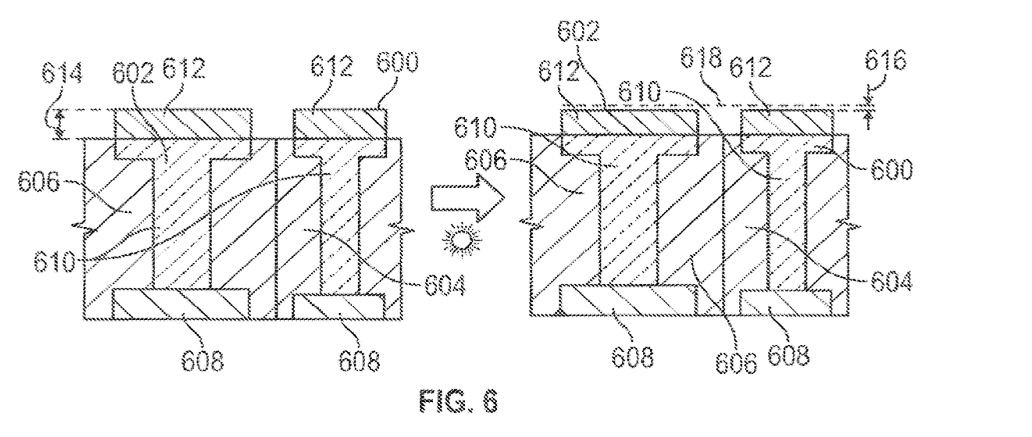
FIG. 6 is a cross section comparison of a second package assembly including via assemblies having electromigration resistant vias in application and reflowed configurations.

FIG. 6 shows one example of first and second via assemblies 600, 602 constructed similarly to the via assembly 400 shown in FIG. 4. For instance, the first and second via assemblies 600, 602 include base pads 608, caps 612 and electromigration resistant vias 610 extending therebetween. Each of the first and second via assemblies 600, 602 have differing profiles. For instance, the first via assembly 600 includes a first assembly profile 604. While the second via assembly 602 includes a second assembly profile 606. In the example shown in FIG. 6, in the application configuration shown on the left portion of the figure, each of the first and second via assemblies 600, 602 are shown with their respective profiles 604, 606 corresponding to a dimensional parameter, such as diameter of the vias 610. In other examples, the first and second assembly profiles 604, 606 correspond to one or more other features of the first and second via assemblies 600, 602 including, but not limited to, one or more of the dimeter of the vias 610 or caps 612, the perimeter of one or more of these features, shape, combination of shape, perimeter, diameter or the like. As shown in FIG. 6, the first and second assembly profiles 604, 606 are different from each other. For instance, the second assembly profile 606 is relatively larger and includes diameters of the electromigration resistant via 610, but is not limited to, diameters of the electromigration resistant via 610 of 70 microns or less, 45 microns or less or the like. Conversely, the first assembly profile 604 of the first via assembly 600 has a smaller profile relative to the second assembly profile 606. For instance, where the first assembly profile 604 corresponds to a diameter of the electromigration resistant via 610, the first assembly profile 604, in various examples, includes diameters of the via including, but not limited to, 23 microns or less, 10 microns or less, 6 microns or less or the like.

As further shown in FIG. 6, the first and second via assemblies 600, 602 are shown in two configurations. An application configuration is shown in the left portion of the Figure and a reflowed configuration is shown in the right portion. In the reflowed configuration, heat is (or was previously) applied to the first and second via assemblies 600, 602 to cause reflow. In some examples, reflowing of the first and second via assemblies 600, 602 including, for instance, their caps 612 facilitates the bonding of the first and second via assemblies 600, 602 with components such as the dies 206, 207 shown in FIG. 2. The reflowing process initiates dimensional changes in the first and second via assemblies 600, 602, for instance, as the caps 612 are bonded with corresponding contacts (e.g., the first or second contact arrays 208, 209 shown in FIG. 2).

As previously described, the electromigration resistant vias 610 provide an electromigration resistant material interposed between the respective base pads 608 and the caps 612. The positioning of the electromigration resistant material within the vias 610 facilitates the minimizing of the height of the caps 612 for each of the first and second via assemblies 600, 602 (e.g., relative to the caps 310 shown in FIG. 3A). At the same time, electromigration resistance is increased by providing an electromigration resistant material in the vias 610 to isolate each of the base pad 608 and the cap 612 from each other.

Because the caps 612 have a decreased thickness or profile relative to the caps previously described herein (See FIG. 3A) during reflowing each of the caps 612 experiences decreased variation including changes in height. For instance, as shown in FIG. 6, the thickness or height variation 616 between the caps 612 of each of the first and second via assemblies 600, 602 in the reflowed configuration is minimized relative to the thickness or height variation 316 of the via assemblies 300, 302 shown in FIG. 3A. In one example, the thickness or height variation 616 is around 5 to 15 percent less, 8 to 12 percent less or the like relative to the thickness or height variation 316 shown in FIG. 3A.

Additionally, the caps 612 of the first and second via assemblies 600, 602 provide a planar die interface profile 618 having a substantially planar characteristic (including incidental variations according to the thickness or height variation 616) relative to the undulating die interface profile 318 shown in FIG. 3A. Because the electromigration resistant material is provided within the vias 610 the caps 612 are minimized in height, and when reflowed the caps 612 have a minimized thickness variation 616. The minimal thickness variation 616 between the caps 612 accordingly provides a planar die interface profile 618 to facilitate the robust and reliable coupling between the caps 612 of the via assemblies 600, 602 and devices, such as the example dies 206, 207 shown in FIG. 2. Accordingly, the first and second via assemblies 600, 602 including via assemblies having differing first and second assembly profiles 604, 606 provide a minimized thickness or height variation 616 relative to previous via assemblies while at the same time enhancing electromigration resistance through positioning of the electromigration resistant material such as nickel, nickel alloys, iron alloys or the like within the vias 610.

Figure 7:
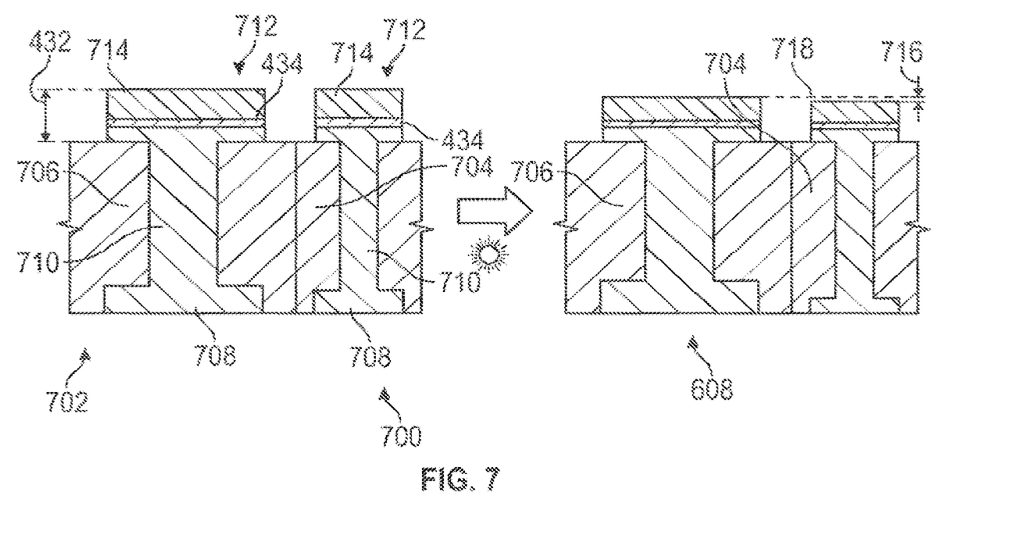
FIG. 7 is a cross section comparison of a third package assembly including via assemblies having electromigration resistant vias in application and reflowed configurations.

FIG. 7 shows another example of via assemblies 700, 702. The first and second via assemblies 700, 702 correspond to the via assembly 500 shown in FIG. 5. For instance, the first and second via assemblies 700, 702 include respective cap assemblies 712 coupled with vias 710. As further shown in FIG. 7, each of the cap assemblies 712 of the first and second via assemblies 700, 702 includes a solder cap layer 432 (e.g., tin) and an intervening electromigration resistant cap layer 434 interposed between the solder cap layer 432 and the via 710. As previously described, the electromigration resistant cap layer 434 includes one or more alloys configured to provide enhanced electromigration resistance relative to other interface cap layer such as nickel. For instance, in one example, the electromigration resistant cap layers 434 of each of the via assemblies 700, 702 includes one or more of nickel alloys, cobalt alloys, iron alloys or the like. In other examples, the alloys are doped with one or more materials including, but not limited to ruthenium, molybdenum or tungsten.

In a similar manner to the via assemblies 600, 602 shown in FIG. 6, the via assemblies 700, 702 including the electromigration resistant cap layers 434 are applied in a relatively thin layer compared to other interface layers such as nickel (e.g., the interface layer 312 shown in FIG. 3A). Enhanced electromigration resistance of these layers 434 facilitates the minimizing of the plating thickness of the layer 434 material and accordingly allows for the minimization of the overall thickness of each of the cap assemblies 712. For instance, as shown in FIG. 7, each of the cap assemblies 712 has a common application thickness 714 corresponding, for instance, to the combined plating thicknesses of each of the solder cap layers 432 and the electromigration resistant cap layers 434 of the cap assemblies 712. The common application thickness 714 of the cap assembly 712 is relatively smaller compared to conventional cap assemblies, for instance, the caps 310 shown in FIG. 3A. Optionally, the cap assemblies 712 further include an underlying layer, such as a portion of the vias 710 as shown in FIG. 7.

Because the cap assemblies 712 are minimized as described herein (e.g., with the inclusion of an electromigration resistant cap layer as described herein), the variation in the cap assemblies 712, for instance, from the application configuration to the reflowed configuration shown in FIG. 7 is minimized. As previously described, each of the first and second via assemblies 700, 702 have a common application thickness 714 for their respective cap assemblies 712. As shown on the right portion of FIG. 7, the first and second via assemblies 700, 702 include the cap assemblies 712 with a minimized thickness or height variation 716. Accordingly, the profile of the first and second via assemblies 700, 702 is a planar die interface profile 718 that facilitates the robust and reliable coupling of the first and second via assemblies 700, 702 with devices, such as the example dies 206, 207 shown in FIG. 2. Stated another way, because the cap assemblies 712 include minimized heights, thicknesses or the like during the application configuration, the variation between the cap assemblies 712 in the reflowed configuration shown on the right portion of FIG. 7 is minimized. For instance, the thickness or height variation 716 is minimized compared to the thickness or height variation 316 shown in FIG. 3. Accordingly, tilted or undulating profiles of the via assemblies 700, 702 are minimized, and instead the planar die interface profile 718 is provided to facilitate the reliable and robust coupling of devices with each of the first and second via assemblies 700, 702.

Additionally, with each of the via assemblies 600, 602 and 700, 702 shown respectively in FIGS. 6 and 7, the electromigration resistant features (vias, cap layers or the like) provide additional benefits for the varying via assemblies provided at varied pitches (e.g., fine or dense in contrast to coarse or less dense). As previously described, in some examples, smaller profile via assemblies such as the first via assemblies 600, 700 shown in FIGS. 6 and 7 are, in one example, clustered in a fine pitched configuration such as the fine center to center pitch of the first via assembly array 332 in FIG. 3B. Conversely, the larger profile via assemblies 602, 702, in other examples, are arranged similar to the less dense (coarse center to center pitch) second via assembly array 334 shown in FIG. 3B.

As previously described, the clustering of smaller via assemblies decreases the spacing between the via assemblies to facilitate clustered electrical interconnections with corresponding fine pitch contact arrays of devices (e.g., the first contact array 208 shown in FIG. 2). Substrate variation 344 shown in FIG. 3B is, in some examples, caused by the buildup layers of the substrate around and within the fine pitch via assemblies. The substrate variation 344 causes an undulating die interface profile 342, as shown in FIG. 3B. In combination with the thickness variation 316 caused by dimensional changes during reflow and the associated undulating die interface profile 318 (see FIG. 3A) the undulating (non-planar) interface profile of the via assemblies is further exaggerated.

In contrast to the substrate variation 344 and undulating die interface profile 342 in FIG. 3B, with the via assemblies described herein (e.g., the via assemblies 600, 700) the minimized profiles of each of the caps or cap assemblies 612, 712 attenuates the substrate variation 344. Stated another way, while some substrate variation may remain during buildup of the substrate in a manner similar to that shown in FIG. 3B, minimal variation is observed because of the profiles of the via assemblies having the electromigration resistant conductive materials. Because the via assemblies 600, 602 and 700, 702 have minimal thickness variations 616, 716 after reflow the substrate variation (e.g., shown in FIG. 3B and caused by substrate build up) is not exaggerated, and an overall planar die interface profile is provided.

Figure 8:
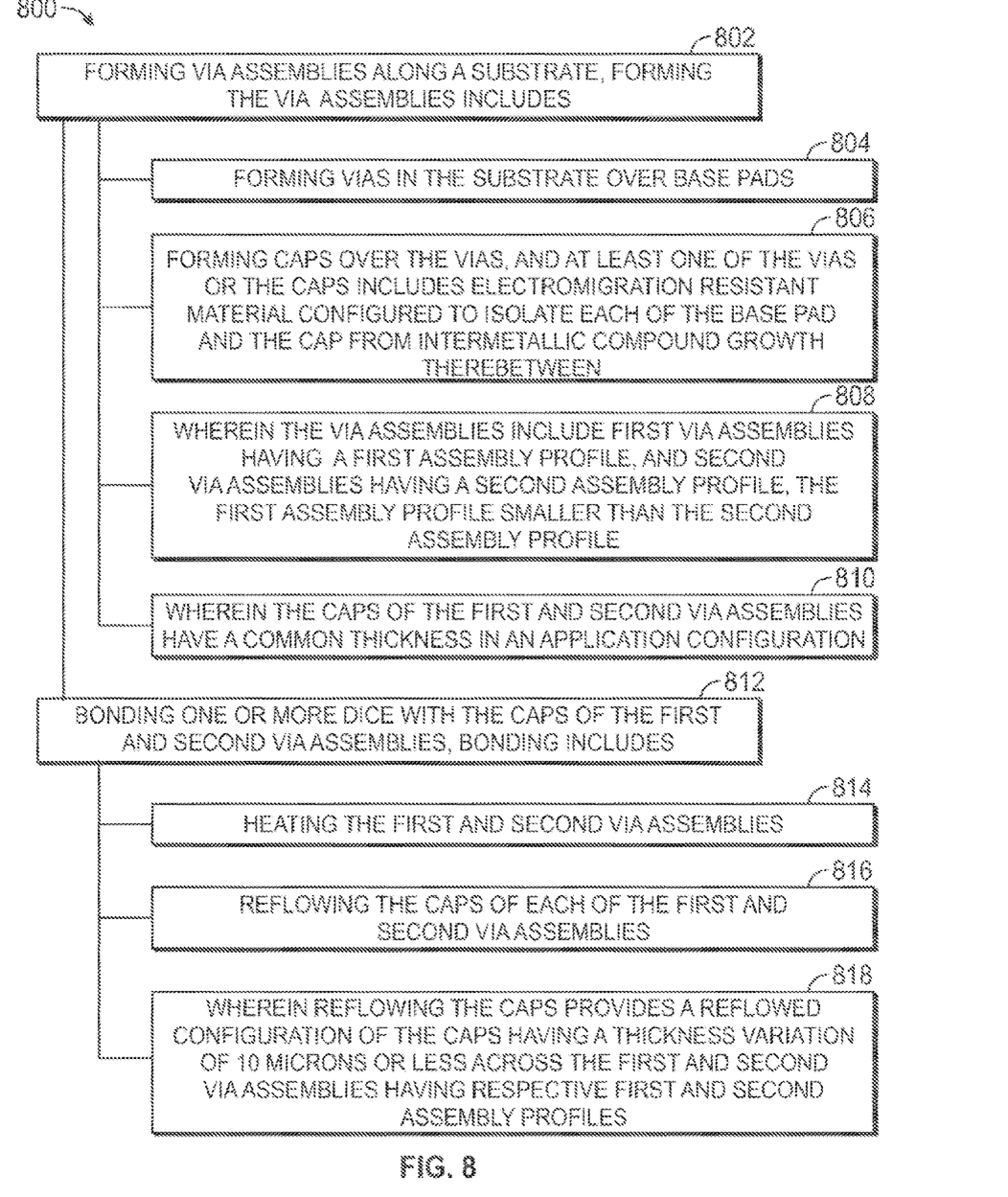
FIG. 8 is a block diagram showing one example of a method for interconnecting die.

FIG. 8 shows one example of a method 800 for interconnecting dies with one or more via assemblies, as described herein. In describing the method 800, reference is made to one or more components, features, functions, steps or the like previously described herein. Where convenient, reference is made to the components, features, steps or the like with reference numerals. The reference numerals provided are exemplary and are not exclusive. For instance, components, features, functions, steps or the like described in the method 800 include, but are not limited to, the corresponding numbered elements provided herein and other corresponding elements described herein (both numbered and unnumbered) as well as their equivalents.

At 802, the method 800 includes forming via assemblies 210, 212 along a substrate 202, as shown by way of example in FIG. 2. Forming the via assemblies includes at 804 forming vias 406 (or 426) in the substrate over base pads 404 (or 424). At 806, caps 410 (or 430) are formed over the vias 406 (or 426), and at least one of the vias or the caps includes electromigration resistant material configured to isolate each of the base pad and the cap from intermetallic compound growth therebetween. At 808 the via assemblies include first via assemblies 600 (or 700) having first assembly profiles 604 (or 704), and second via assemblies 602 (or 702) having second assembly profiles 606 (or 706) as shown in FIG. 6 (or 7). In one example, the first assembly profiles are smaller than the second assembly profiles. At 810, the caps 612 (or 712) of the first and second via assemblies have a common thickness in an application configuration (e.g., as shown in the left views of FIGS. 6 and 7).

At 812, the method 800 includes bonding one or more die, such as the first die 206 and or second die 208 of FIG. 2 with the caps of the first and second via assemblies. Bonding includes, at 814, heating the first and second via assemblies. The caps 612 (or 712) of the first and second via assemblies are reflowed, for instance according to the heating. At 816, reflowing the caps 612 (or 712) provides a reflowed configuration of the caps having a thickness variation of 10 microns or less across the first and second via assemblies 600 (700), 602 (702) having the respective first and second assembly profiles.

Several options for the method 800 follow. In one example, reflowing the caps provides the reflowed configuration of the caps having a thickness variation 616 (or 716) of 3 microns or less across the first and second via assemblies having respective first and second assembly profiles. As previously described herein, the minimized thickness variations (relative to previous via assemblies and packages) enhances the interface profiles of the via assemblies (see the planar die interface profiles 618, 718 shown in FIGS. 6 and 7).

In another example, forming vias in the substrate each includes filling a via passage 408 with the electromigration resistant material between a via base 416 proximate the base pad 404 and a via apex 418 proximate the cap assembly 410 (e.g., a cap). Optionally, forming caps over the vias includes applying the electromigration resistant material as a cap layer 434 (e.g., an electromigration resistant cap layer) between a via apex 428 of the via 426 and a solder cap layer 432 of the cap 430 (e.g., a cap assembly). In still another example, forming via assemblies includes forming the vias and the caps of the first via assemblies with the first assembly profile 604 (or 704) at a first center to center pitch (e.g., measured from the centers of the vias of the first via assemblies), and forming the vias and the caps of the second via assemblies with the second assembly profile 606 (or 706) at a second center to center pitch greater (e.g., measured from the centers of the vias of the second via assemblies).

In one example, forming the vias and caps of the first via assemblies with the first assembly profile 604 (or 704) includes each of the caps and vias having a first diameter of around 10 microns or less, and forming the vias and caps of the second via assemblies with the second assembly profile 606 (or 706) includes each of the caps and vias having a second diameter of around 45 microns or less. In another example, forming caps over the vias of each of the first and second via assemblies is performed at the same time and with the common thickness as shown, for instance, in the left views of FIGS. 6 and 7.

VARIOUS NOTES & EXAMPLES

Example 1 can include subject matter, such as a package assembly comprising: a substrate extending from a first substrate end to a second substrate end, the substrate includes a plurality of conductive traces; one or more die coupled along the substrate, at least a first die of the one or more die includes a first array of contacts; and a plurality of via assemblies interposed between at least the first array of contacts and the plurality of conductive traces, and each via assembly between the first array and the plurality of conductive traces includes: a base pad in communication with a conductive trace of the plurality of conductive traces, the base pad includes at least a first conductive material, a cap in communication with a contact of the first array of contacts, the cap includes at least a second conductive material different from the first conductive material, and an electromigration resistant via within a via passage between the base pad and the cap, the electromigration resistant via is configured to isolate each of the base pad and the cap from intermetallic compound growth and includes a third conductive material different from the first and second conductive materials.

Example 2 can include, or can optionally be combined with the subject matter of Example 1, to optionally include wherein the electromigration resistant via includes a nickel filler, a nickel alloy filler, a cobalt alloy filler or an iron alloy filler.

Example 3 can include, or can optionally be combined with the subject matter of one or any combination of Examples 1 or 2 to optionally include wherein the nickel alloy filler includes nickel and one or more of tungsten, molybdenum or ruthenium.

Example 4 can include, or can optionally be combined with the subject matter of one or any combination of Examples 1-3 to optionally include wherein the cap includes a solder cap layer and an electromigration resistant cap layer interposed between the solder cap layer and the electromigration resistant via.

Example 5 can include, or can optionally be combined with the subject matter of one or any combination of Examples 1-4 to optionally include wherein the base pad includes a first volume of the first conductive material, and the electromigration resistant via includes a third volume of the third conductive material greater than the first volume.

Example 6 can include, or can optionally be combined with the subject matter of Examples 1-5 to optionally include wherein the cap includes a second volume of the second conductive material, and the electromigration resistant via includes a third volume of the third conductive material greater than the second volume.

Example 7 can include, or can optionally be combined with the subject matter of Examples 1-6 to optionally include wherein the electromigration resistant via extends between a via base proximate the base pad and a via apex proximate the cap.

Example 8 can include, or can optionally be combined with the subject matter of Examples 1-7 to optionally include wherein the first conductive material of the base pad is remote relative to the second conductive material of the cap according to the electromigration resistant via between the base pad and the cap.

Example 9 can include, or can optionally be combined with the subject matter of Examples 1-8 to optionally include wherein the first die includes: the first array of contacts having a fine contact pitch, and a second array of contacts having a coarse contact pitch greater than the fine contact pitch; and wherein the plurality of conductive traces includes: a first array of conductive traces having a fine trace pitch, and a second array of conductive traces having a coarse trace pitch greater than the fine contact pitch.

Example 10 can include, or can optionally be combined with the subject matter of Examples 1-9 to optionally include wherein the plurality of via assemblies are interposed between the first and second arrays of contacts and the first and second arrays of conductive traces, respectively, and each via assembly between the second array of contacts and the second array of conductive traces includes: a second base pad in communication with a second conductive trace of the plurality of conductive traces, the second base pad includes at least the first conductive material, a second cap in communication with a second contact of the second array of contacts, the second cap includes at least the second conductive material, and a second electromigration resistant via within a second via passage between the second base pad and the second cap, the electromigration resistant via is configured to isolate each of the second base pad and the second cap from intermetallic compound growth and includes the third conductive material.

Example 11 can include, or can optionally be combined with the subject matter of Examples 1-10 to optionally include a package assembly comprising: a substrate extending from a first substrate end to a second substrate end; one or more die coupled along the substrate, at least a first die of the one or more die includes a first contact array and a second contact array; first via assemblies coupled with the first contact array and second via assemblies coupled with the second contact array, and each of the first and second via assemblies includes: a base pad including at least a first conductive material, a cap assembly including at least a second conductive material, a via interposed between the cap assembly and the base pad, and one or more of the cap assembly or the via includes an electromigration resistant material configured to isolate each of the base pad and the cap assembly from intermetallic compound growth; and wherein each first cap assembly and via of the first via assemblies has a first assembly profile less than a second assembly profile of each second cap assembly and via of the second via assemblies, and the first and second cap assemblies include application and reflowed configurations: in the application configuration the first and second cap assemblies have a common applied thickness, and in the reflowed configuration the first and second cap assemblies have a thickness variation of ten microns or less.

Example 12 can include, or can optionally be combined with the subject matter of Examples 1-11 to optionally include wherein the thickness variation is 5 microns or less.

Example 13 can include, or can optionally be combined with the subject matter of Examples 1-12 to optionally include wherein the thickness variation is 3 micron or less.

Example 14 can include, or can optionally be combined with the subject matter of Examples 1-13 to optionally include wherein the first assembly profile of the first cap assembly and via is a first diameter of around 23 microns or less and the second assembly profile of the second cap assembly and via is a second diameter of around 70 microns or less.

Example 15 can include, or can optionally be combined with the subject matter of Examples 1-14 to optionally include wherein the first assembly profile of the first cap assembly and via is a first diameter of around 10 microns or less and the second assembly profile of the second cap assembly and via is a second diameter of around 45 microns or less.

Example 16 can include, or can optionally be combined with the subject matter of Examples 1-15 to optionally include wherein the first assembly profile of the first cap assembly and via is a first diameter of around 6 microns or less and the second assembly profile of the second cap assembly and via is a second diameter of around 45 microns or less.

Example 17 can include, or can optionally be combined with the subject matter of Examples 1-16 to optionally include wherein the vias of the first and second via assemblies include the electromigration resistant material extending between a via base proximate the base pad and a via apex proximate the cap assembly.

Example 18 can include, or can optionally be combined with the subject matter of Examples 1-17 to optionally include wherein the first and second cap assemblies include an electromigration resistance cap layer of the electromigration resistant material between a solder cap layer and a via apex of the vias.

Example 19 can include, or can optionally be combined with the subject matter of Examples 1-18 to optionally include wherein the substrate includes one or more of an embedded multi-die interconnect bridge assembly or a patch on interface assembly.

Example 20 can include, or can optionally be combined with the subject matter of Examples 1-19 to optionally include a method for interconnecting dies comprising: forming via assemblies along a substrate, forming the via assemblies includes: forming vias in the substrate over base pads, forming caps over the vias, and at least one of the vias or the caps includes electromigration resistant material configured to isolate each of the base pad and the cap from intermetallic compound growth therebetween, wherein the via assemblies include first via assemblies having a first assembly profile, and second via assemblies having second assembly profiles, the first assembly profile smaller than the second assembly profile, and wherein the caps of the first and second via assemblies have a common thickness in an application configuration; and bonding one or more die with the caps of the first and second via assemblies, bonding includes: heating the first and second via assemblies, reflowing the caps of each of the first and second via assemblies, and wherein reflowing the caps provides a reflowed configuration of the caps having a thickness variation of 10 microns or less across the first and second via assemblies having respective first and second assembly profiles.

Example 21 can include, or can optionally be combined with the subject matter of Examples 1-20 to optionally include wherein reflowing the caps provides the reflowed configuration of the caps having a thickness variation 3 microns or less across the first and second via assemblies having respective first and second assembly profiles.

Example 22 can include, or can optionally be combined with the subject matter of Examples 1-21 to optionally include wherein forming vias in the substrate each includes filling a via passage with the electromigration resistant material between a via base proximate the base pad and a via apex proximate the cap assembly.

Example 23 can include, or can optionally be combined with the subject matter of Examples 1-22 to optionally include wherein forming caps over the vias each includes applying the electromigration resistant material as a cap layer between a via apex of the via and a solder cap layer of the cap.

Example 24 can include, or can optionally be combined with the subject matter of Examples 1-23 to optionally include wherein forming via assemblies includes: forming the vias and the caps of the first via assemblies with the first assembly profile at a first center to center pitch, and forming the vias and the caps of the second via assemblies with the second assembly profile at a second center to center pitch greater than the first center to center pitch.

Example 25 can include, or can optionally be combined with the subject matter of Examples 1-24 to optionally include wherein forming the vias and caps of the first via assemblies with the first assembly profile includes each of the caps and vias having a first diameter of around 10 microns or less, and forming the vias and caps of the second via assemblies with the second assembly profile includes each of the caps and vias having a second diameter of around 45 microns or less.

Example 26 can include, or can optionally be combined with the subject matter of Examples 1-25 to optionally include wherein forming caps over the vias of each of the first and second via assemblies is performed at the same time and with the common thickness.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the disclosure can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosure should be determined with reference to the appended claims, along with the full scope of equivalents to which such claims are entitled.

What is claimed is:

1. A composite device assembly comprising:
 a plurality of dies, each die of the plurality of dies includes a respective array of contacts;
 a substrate extending from a first substrate end to a second substrate end, the plurality of dies are coupled along the substrate, the substrate includes:
  one or more interconnect bridges having associated conductive traces, the one or more interconnect bridges configured to interconnect the plurality of dies; and
 a plurality of via assemblies; and
 each via assembly of the plurality of via assemblies is interposed between the array of contacts of a die of the plurality of dies and the conductive traces of an interconnect bridge of the one or more interconnect bridges, each via assembly includes:
  a base pad in communication with a conductive trace of the interconnect bridge, the base pad including a first conductive material;
  a structure in communication with a contact of the first array of contacts, the structure including a solder layer including a second conductive material different from the first conductive material, and the structure including a material layer, the material comprises a metal selected from the group consisting of nickel, cobalt and iron, the solder layer on the material layer, the material layer having a third conductive material different from the first and second conductive materials, the material layer configured to isolate each of the base pad and the solder layer from intermetallic compound growth; and a via between the base pad and the structure, the via including the first conductive material.

2. The composite device assembly of claim 1, wherein the material layer includes nickel.

3. The composite device assembly of claim 2, wherein the material layer including nickel includes a nickel alloy having one or more of tungsten molybdenum or ruthenium.

4. The composite device assembly of claim 1, wherein the material layer includes cobalt.

5. The composite device assembly of claim 1, wherein the material layer includes iron.

6. The composite device assembly of claim 1, wherein the material layer includes one or more of a cobalt alloy or an iron alloy.

7. The composite device assembly of claim 1, wherein the plurality of dies includes a first die having a fine pitch array of contacts and a second die having a coarse pitch array of contacts with a greater contact pitch than the fine pitch array of contacts; and wherein the one or more interconnect bridges includes a first interconnect bridge and a second interconnect bridge.

8. The composite device assembly of claim 7, wherein the plurality of via assemblies comprises:

a first via assembly array of the plurality of via assemblies, the first via assembly array having a fine via pitch; and a second via assembly array of the plurality of via assemblies, the second via assembly array having a coarse via pitch.

9. The composite device assembly of claim 8, wherein small profile caps of the first via assembly array and large profile caps of the second via assembly array have a thickness variation of ten microns or less.

10. The composite device assembly of claim 9, wherein the thickness variation is 5 microns or less.

11. A composite device assembly comprising:

a plurality of dies, each die of the plurality of dies includes a respective array of contacts;

a substrate extending from a first substrate end to a second substrate end, the plurality of dies are coupled along the substrate, the substrate includes:

one or more interconnect bridges having associated conductive traces, the one or more interconnect bridges configured to interconnect the plurality of dies; and a plurality of via assemblies; and each via assembly of the plurality of via assemblies is interposed between the array of contacts of a die of the plurality of dies and the conductive traces of an interconnect bridge of the one or more interconnect bridges, each via assembly includes:

a base pad in communication with a conductive trace of the interconnect bridge, the base pad including a first conductive material;

a structure in communication with a contact of the first array of contacts, the structure including a first layer including a second conductive material different from the first conductive material, and the structure including a second layer, the first layer on the second layer, the second layer having a third conductive material different from the first and second conductive materials; and a via between the base pad and the structure, the via including the first conductive material.

12. The composite device assembly of claim 11, wherein the second layer includes nickel.

13. The composite device assembly of claim 12, wherein the second layer including nickel includes a nickel alloy having one or more of tungsten molybdenum or ruthenium.

14. The composite device assembly of claim 11, wherein the second layer includes cobalt.

15. The composite device assembly of claim 11, wherein the second layer includes iron.

16. The composite device assembly of claim 11, wherein the second layer includes one or more of a cobalt alloy or an iron alloy.

17. The composite device assembly of claim 11, wherein the plurality of dies includes a first die having a fine pitch array of contacts and a second die having a coarse pitch array of contacts with a greater contact pitch than the fine pitch array of contacts; and wherein the one or more interconnect bridges includes a first interconnect bridge and a second interconnect bridge.

18. The composite device assembly of claim 17, wherein the plurality of via assemblies comprises:

a first via assembly array of the plurality of via assemblies, the first via assembly array having a fine via pitch; and a second via assembly array of the plurality of via assemblies, the second via assembly array having a coarse via pitch.

19. The composite device assembly of claim 18, wherein small profile caps of the first via assembly array and large profile caps of the second via assembly array have a thickness variation of ten microns or less.

20. The composite device assembly of claim 19, wherein the thickness variation is 5 microns or less.

* * * * *